United States Patent
Olsson (10) Patent No.: US 12,355,442 B2
(45) Date of Patent: Jul. 8, 2025

(54) FIELD-PROGRAMMABLE GATE ARRAY DEVICE

(71) Applicant: Epinovatech AB, Lund (SE)

(72) Inventor: Martin Andreas Olsson, Lund (SE)

(73) Assignee: Epinovatech AB, Lund (SE)

( * ) Notice: Subject to any disclaimer, the term of this patent is extended or adjusted under 35 U.S.C. 154(b) by 0 days.

(21) Appl. No.: 18/629,267

(22) Filed: Apr. 8, 2024

(65) Prior Publication Data

US 2024/0250686 A1    Jul. 25, 2024

Related U.S. Application Data (63) Continuation of application No. 17/905,908, filed as application No. PCT/EP2021/055980 on Mar. 10, 2021, now Pat. No. 11,955,972.

(30) Foreign Application Priority Data

Mar. 13, 2020 (EP) .................................. 20163052

(51) Int. Cl.
   *H03K 19/17728* (2020.01)
   *H03K 19/17724* (2020.01)
   (Continued)

(52) U.S. Cl.
   CPC . *H03K 19/17728* (2013.01); *H03K 19/17744* (2013.01); *H03K 19/1776* (2013.01)

(58) Field of Classification Search
   None
   See application file for complete search history.

(56) References Cited

U.S. PATENT DOCUMENTS

| 2,463,073 A | 3/1949 | Webb |
| 4,103,325 A | 7/1978 | Hyman et al. |

(Continued)

FOREIGN PATENT DOCUMENTS

| CN | 1599099 | 3/2005 |
| CN | 101621292 | 5/2012 |

(Continued)

OTHER PUBLICATIONS

Anonymous, "High-electron-mobility transistor—Wikipedia", Mar. 6, 2020 (Mar. 6, 2020), XP055808423, Retrieved from the Internet: URL:https://en.wikipedia.org/w/index.php?title=High-electron-mobility transistor&old id=944233239, retrieved on May 27, 2021 6 pages.

(Continued)

*Primary Examiner* — Anh Q Tran
(74) *Attorney, Agent, or Firm* — Knobbe, Martens, Olson & Bear, LLP (57) ABSTRACT

There is provided a field-programmable gate array, FPGA, device (100) comprising a configurable logic block, CLB, (110) comprising a logic inverter (120) comprising a high-electron-mobility transistor, HEMT, (130), wherein the HEMT comprises: a Si substrate (384); an $Al_yGa_{y-1}N$ layer structure (380), wherein $0<y\le1$; a GaN layer structure (382); and a crystal transition layer structure (386) arranged on the Si substrate. The crystal transition layer comprises: a plurality of vertical nanowire structures (388) perpendicularly arranged on the Si substrate, and an $Al_xGa_{x-1}N$ layer structure (389), wherein $0\le x<1$, wherein the $Al_xGa_{x-1}N$ layer structure is arranged to vertically and laterally enclose the vertical nanowire structures. There is also provided an AI processing system comprising said FPGA device (100).

10 Claims, 7 Drawing Sheets

(51) Int. Cl.
*H03K 19/17736* (2020.01)
*H03K 19/1776* (2020.01)

(56) References Cited

U.S. PATENT DOCUMENTS

| | | |
|---|---|---|
| 4,873,497 A | 10/1989 | Kielmeyer |
| 7,250,359 B2 | 7/2007 | Fitzgerald |
| 8,094,223 B1 | 1/2012 | De Wit et al. |
| 8,324,660 B2 | 12/2012 | Lochtefeld et al. |
| 8,344,242 B2 | 1/2013 | Fiorenza et al. |
| 9,275,857 B1 | 3/2016 | Hersee |
| 9,379,204 B2 | 6/2016 | Fogel et al. |
| 9,764,950 B2 | 9/2017 | Colinge et al. |
| 9,887,637 B1 | 2/2018 | Shah et al. |
| 9,979,326 B1 | 5/2018 | Zanelato et al. |
| 9,984,872 B2 | 5/2018 | Park et al. |
| 10,387,792 B1 | 8/2019 | Ladd et al. |
| 10,439,671 B2 | 10/2019 | Kamgaing et al. |
| 10,742,208 B1 | 8/2020 | Moyer et al. |
| 11,316,165 B2 | 4/2022 | Olsson |
| 11,469,300 B2 | 10/2022 | Olsson |
| 11,634,824 B2 | 4/2023 | Olsson |
| 11,652,454 B2 | 5/2023 | Olsson |
| 11,695,066 B2 | 7/2023 | Olsson |
| 11,955,972 B2 | 4/2024 | Olsson |
| 12,009,431 B2 | 6/2024 | Olsson |
| 12,027,989 B2 | 7/2024 | Olsson |
| 12,068,726 B2 | 8/2024 | Olsson |
| 12,148,821 B2 | 11/2024 | Olsson |
| 2003/0022395 A1 | 1/2003 | Olds |
| 2003/0165418 A1 | 9/2003 | Ajayan |
| 2005/0064291 A1 | 3/2005 | Sato et al. |
| 2005/0159000 A1 | 7/2005 | Ohno et al. |
| 2005/0189566 A1 | 9/2005 | Matsumoto et al. |
| 2006/0134883 A1 | 6/2006 | Hantschel |
| 2006/0189018 A1 | 8/2006 | Yi |
| 2006/0216815 A1 | 9/2006 | Cheng et al. |
| 2007/0108435 A1 | 5/2007 | Harmon |
| 2007/0197396 A1 | 8/2007 | Holcomb |
| 2007/0215899 A1 | 9/2007 | Thomas |
| 2007/0277866 A1 | 12/2007 | Sander et al. |
| 2007/0295993 A1 | 12/2007 | Chen et al. |
| 2008/0122418 A1 | 5/2008 | Biere et al. |
| 2008/0153000 A1 | 6/2008 | Salot et al. |
| 2008/0171424 A1 | 7/2008 | Li |
| 2009/0269909 A1 | 10/2009 | Kim |
| 2010/0097027 A1 | 4/2010 | Jackson |
| 2010/0176459 A1 | 7/2010 | Wernersson et al. |
| 2010/0259186 A1 | 10/2010 | Ernoux |
| 2010/0027665 A1 | 11/2010 | Wang |
| 2010/0276664 A1 | 11/2010 | Hersee |
| 2010/0276665 A1 | 11/2010 | Wang |
| 2010/0314617 A1 | 12/2010 | Ito |
| 2011/0020704 A1 | 1/2011 | Fukuchi |
| 2011/0036396 A1 | 2/2011 | Jayaraman |
| 2011/0140072 A1 | 6/2011 | Varangis |
| 2011/0143472 A1 | 6/2011 | Seifert |
| 2011/0204381 A1 | 8/2011 | Okada et al. |
| 2011/0233575 A1 | 9/2011 | Huang et al. |
| 2011/0253187 A1 | 10/2011 | Ohta et al. |
| 2012/0001153 A1 | 1/2012 | Hersee |
| 2012/0052560 A1 | 3/2012 | Knight et al. |
| 2012/0235117 A1 | 9/2012 | Takashi et al. |
| 2012/0292592 A1 | 11/2012 | Hwang et al. |
| 2013/0061747 A1 | 3/2013 | Turnbull et al. |
| 2013/0126907 A1 | 5/2013 | Kitano et al. |
| 2013/0175501 A1 | 7/2013 | Hersee |
| 2013/0187627 A1 | 7/2013 | Imada et al. |
| 2014/0008609 A1 | 1/2014 | Chiu |
| 2014/0078781 A1 | 3/2014 | Imada |
| 2014/0134773 A1 | 5/2014 | Rakesh et al. |
| 2014/0183446 A1 | 7/2014 | Nago et al. |
| 2014/0197130 A1 | 7/2014 | Lemke |
| 2014/0231870 A1 | 8/2014 | Hoke |
| 2014/0239346 A1 | 8/2014 | Green et al. |
| 2015/0014631 A1 | 1/2015 | Ohlsson |
| 2015/0060996 A1 | 3/2015 | Colinge |
| 2015/0076450 A1 | 3/2015 | Weman |
| 2015/0084685 A1 | 3/2015 | Hirose et al. |
| 2015/0118572 A1 | 4/2015 | Lund et al. |
| 2015/0155275 A1 | 6/2015 | Bahramian et al. |
| 2015/0171784 A1 | 6/2015 | Lipo et al. |
| 2015/0236134 A1 | 8/2015 | Zhong et al. |
| 2015/0263100 A1 | 9/2015 | Deboy |
| 2015/0311072 A1 | 10/2015 | Aagesen |
| 2015/0318448 A1 | 11/2015 | Nan et al. |
| 2015/0333216 A1 | 11/2015 | Pourquire |
| 2016/0172305 A1 | 6/2016 | Sato |
| 2016/0211789 A1 | 7/2016 | Hanft et al. |
| 2016/0276433 A1 | 9/2016 | Holland |
| 2017/0002471 A1 | 1/2017 | Okamoto |
| 2017/0062213 A1 | 3/2017 | Patolsky |
| 2017/0110332 A1 | 4/2017 | Beveridge |
| 2017/0125574 A1 | 5/2017 | Chowdhury et al. |
| 2017/0178971 A1 | 6/2017 | Merckling et al. |
| 2017/0200820 A1 | 7/2017 | Conway et al. |
| 2017/0229569 A1 | 8/2017 | Chowdhury et al. |
| 2017/0257025 A1 | 9/2017 | Meiser |
| 2017/0309736 A1 | 10/2017 | Huang et al. |
| 2017/0323788 A1 | 11/2017 | Mi |
| 2017/0338277 A1 | 11/2017 | Banna et al. |
| 2018/0033889 A1 | 2/2018 | Yang et al. |
| 2018/0229618 A1 | 8/2018 | Lee et al. |
| 2018/0316383 A1 | 11/2018 | Kamgaing et al. |
| 2019/0013404 A1 | 1/2019 | Carlson et al. |
| 2019/0081164 A1 | 3/2019 | Shrivastava |
| 2019/0165182 A1 | 5/2019 | Van Dal |
| 2019/0229149 A1 | 7/2019 | Yoo |
| 2019/0252377 A1 | 8/2019 | Clarke et al. |
| 2019/0284706 A1 | 9/2019 | Takeda et al. |
| 2019/0356278 A1 | 11/2019 | Smith |
| 2019/0393104 A1 | 12/2019 | Ando |
| 2020/0027972 A1 | 1/2020 | Petta et al. |
| 2020/0127173 A1 | 4/2020 | Park et al. |
| 2020/0161531 A1 | 5/2020 | Olivadese et al. |
| 2020/0185219 A1 | 6/2020 | Busani et al. |
| 2020/0185386 A1 * | 6/2020 | Yamazaki ............ H01L 27/1255 |
| 2020/0194416 A1 | 6/2020 | Or-Bach et al. |
| 2020/0203556 A1 | 6/2020 | Feuillet et al. |
| 2020/0256710 A1 * | 8/2020 | Rule ................ H03K 19/17724 |
| 2020/0381538 A1 | 12/2020 | Shih et al. |
| 2021/0057601 A1 | 2/2021 | Oliver et al. |
| 2021/0265632 A1 | 8/2021 | Olsson |
| 2021/0288539 A1 | 9/2021 | Abdel-Khalik et al. |
| 2021/0327712 A1 | 10/2021 | Olsson |
| 2022/0231298 A1 | 7/2022 | Olsson |
| 2022/0302293 A1 | 9/2022 | Olsson |
| 2022/0393656 A1 | 12/2022 | Olsson |
| 2022/0396886 A1 | 12/2022 | Olsson |
| 2022/0399826 A1 | 12/2022 | Olsson |
| 2022/0416025 A1 | 12/2022 | Olsson |
| 2023/0119801 A1 | 4/2023 | Olsson |
| 2023/0146820 A1 | 5/2023 | Olsson |
| 2023/0261621 A1 | 8/2023 | Olsson |
| 2023/0327009 A1 | 10/2023 | Olsson |
| 2023/0352575 A1 | 11/2023 | Olsson |
| 2024/0186365 A1 | 6/2024 | Olsson |
| 2024/0235412 A1 | 7/2024 | Olsson |
| 2024/0332423 A1 | 10/2024 | Olsson |
| 2024/0356456 A1 | 10/2024 | Olsson |
| 2024/0363693 A1 | 10/2024 | Olsson |
| 2024/0380369 A1 | 11/2024 | Olsson |
| 2025/0040175 A1 | 1/2025 | Olsson |

FOREIGN PATENT DOCUMENTS

| | | | |
|---|---|---|---|
| CN | 103477418 | 12/2013 | |
| CN | 105914232 | 8/2016 | |
| CN | 105990443 | 10/2016 | |
| CN | 106549050 | 3/2017 | |
| CN | 110324568 | 10/2019 | |
| CN | 110336028 | 3/2021 | |
| CN | 112490243 A * | 3/2021 | ......... H01L 21/8252 |
| EP | 1959530 | 8/2008 | |

(56) References Cited

FOREIGN PATENT DOCUMENTS

| | | |
|---|---|---|
| EP | 2075745 | 7/2009 |
| EP | 2571065 | 3/2013 |
| EP | 2816729 | 12/2014 |
| EP | 284700 | 1/2015 |
| EP | 2838125 | 2/2015 |
| EP | 2955763 | 12/2015 |
| GB | 2520687 | 6/2015 |
| JP | 2000101152 | 4/2000 |
| JP | 2003101069 | 4/2003 |
| JP | 2005268555 | 9/2005 |
| JP | 2008057383 | 3/2008 |
| JP | 2010232423 | 10/2010 |
| JP | 2014146744 | 8/2014 |
| JP | 2014217252 | 11/2014 |
| KR | 10-2013-0030193 | 3/2013 |
| TW | 201036347 | 10/2010 |
| WO | WO 95/08452 | 3/1995 |
| WO | WO 2010/100599 | 9/2010 |
| WO | WO 2012/077513 | 6/2012 |
| WO | WO 2012/105901 | 8/2012 |
| WO | WO 2013/049817 | 4/2013 |
| WO | WO 2017/111844 | 6/2017 |
| WO | WO 2017/213644 | 12/2017 |
| WO | WO 2019/144966 | 8/2019 |
| WO | WO 2019/202258 | 10/2019 |
| WO | WO 2020/222149 | 11/2020 |
| WO | WO 2021/021415 | 2/2021 |

OTHER PUBLICATIONS

Anonymous, "Phase-shift oscillator Wikipedia" Apr. 7, 2019 (Apr. 7, 2019), XP055733459, Retrieved from the Internet: URL:https://en.wikipedia.org/w/index.php?title=Phase-shift- oscillator&oldid=89138949 5, retrieved on Sep. 23, 2020 in 3 pages.

Dahal et al., "Realizing InGaN monolithic solar-photoelctrochemical cells for artificial photosynthesis", Appl. Phys, Lett. 104, 143901, (2014); Published Onlines: Apr. 9, 2014.

Faunce et al., "Nanotechnology, Plasma, Hydrogen from Artificial Photosynthesis, and Fuel Cells: Powering the Developing World to the Sustainocene", Nanotechnology Toward the Sustoinocene, Chapter 11, pp. 241-257.

Gust et al., "Solar Fukes via Artificial Photosynthesis", Department of Chemistry and Biochemestry and Center for Bioenergy and Photosynthesis, Arizona State University, Jul. 17, 2009, in 9 pages.

Iqbal et al. "Reactive Sputtering of Aluminum Nitride Thin Files for Piezoeletric Applications: A Review", Sensors, vol. 18, No. 6, Jun. 2018 in 21 pages.

Kampl et al., "2500 W full-bridge totem-pole power factor correction using CoolGaN," Nov. 5, 2018, pp. 1-46.

Kozodoy et al. "Polarization-enhanced Mg doping of AlGaN/GaN superlattices," Applied Physics Letters, vol. 75, No. 16, Oct. 18, 1999, pp. 2444-2446.

Krishna et al. "AlGaN/GaN Superlattice-Based p-Type Field-Effect Transistor with Tetramethylammoninum Hydoxide Treatment," Physica Status Solidi, vol. 217, No. 7, Apr. 1, 2020 in 8 pages.

Lin et al., "Physical and electrical characteristics of AlGaN/GaN metal-oxide-semiconductor high-electron-mobility transistors with rare earth Er2O3 as a gate dielectric", Thin Solid Films, vol. 544, Oct. 2013 (Oct. 2013), pp. 526-529.

Lu et al., "Paralleling GaN E-HEMTs in 10KW-100KW systems," 2017 IEEE Applied Power Electronics Conference and Exposition, Mar. 26, 2017, pp. 3049-3056.

Matioli et al. "Room-Temperature Ballistic Transport in III-Nitride Heterostructures," ResearchGate, https://www.researchgate.net/publication/271329249_Room-Temperature_Ballistic_Transport_in_III-Nitride_Heterostructures/link/57d9301d08ae6399a39acce3/download ?_ tp=eyJjb250ZXh0IjP7ImZpcnN0UGFnZSI6InB1Ym xpY2F0aW9uliwicGFnZSI6InB1YmxpY2F0aW9uIn19, Jan. 2015, in 10 pages.

Mitsunari et al., "Single-crystalline semipolar GaN on Si(001) using a directional suptterred AlN intermediate layer", Journal of Crystal Growth, 2015 in 4 pages.

Mukhopadhyay, P. "Comparative DC Characteristic Analysis of AlGaN/GaN HEMTs Grown on Si(111) and Sapphire Substrates by MBE" Jour. of Elec. Mat. vol. 43, No. 4, Feb. 14, 2014 pp. 1263-1270 (Year: 2014).

Park, J. "Comparison of AlGaN/GaN High Electron Mobility Transistor with AlN or GaN as a cap layer" Conference paper proceedings on Research Gate available online at address recited in the Office Action as of Jul. 14, 2015 pp. 1-2 (Year: 2015).

Raj et al. "Demonstration of a GaN/AlGaN Superlattice-Based p-Channel FinFET With High ON-current," IEEE Electron Device Letters, vol. 41, No. 2, Dec. 31, 2019, pp. 220-223.

Shibata, D. "1. 7 kV/ 1.0 mQcm2 Normally-off Vertical GaN Transistor on GaN substrate with Regrown p-GaN/AlGaN/GaN SemipolarGate Structure" IEEE Int. Elec. Dev. Meet. IEDM 2016, Feb. 2, 2017 pp. 248-251 (Year: 2016).

Shrestha et al. "Optimal design 5,9 of the multiple-apertures-GaN-based vertical HEMTs with SiO2 current blocking layer", Journal of Computational Electronics, Springer US, Boston, vol. 15, No. 1. Aug. 7, 2015 (Aug. 7, 2015pp. 154-162.

Zhang et al., "Conducted noise reduction of totem-pole bridgeless PFC converter using GaN HEMTs," 2015 IEEE International Telecommunications Energy Conference, Oct. 18, 2015, pp. 1-5.

Doring et al., "Technology of GaN-Based Large Area CAVETs With Co-Integrated HEMTs," IEEE Transactions on Electron Devices, vol. 68, No. 11, Nov. 2021, pp. 5547-5552.

Eickhoff et al., "Piezoresistivity of Alx Ga1-xN layers and Alx Ga10xN/GaN heterostructures," Journal of Applied Physics, American Institute of Physics, vol. 90, No. 7, Oct. 1, 2001, pp. 3383-3386.

Jones et al., "Review of Commercial GaN Power Devices and GaN-Based Converter Design Challenges," IEEE, vol. 4, No. 3, Sep. 2016, pp. 707-719.

Seo et al., "i-based nonalloyed Ohmic contacts for AI0. 15Ga0. 85N/GaN high electron mobilitytransistors using regrown n+-GaN by plasma assisted molecular beam epitaxy," Applied Physics Letters, vol. 93, Issue 10, Sep. 8, 2008, pp. 102102-102102.

International Search Report and Written Opinion of PCT/EP2021/055980, dated May 18, 2021 in 11 pages.

Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials.

Asghar Asgari, "Negative Differential Capacitance of AlGaN/GaN Heterostructure in Presence of InN Quantum Dots", SPIE, PO Box 10 Bellingham WA 98227-0010 USA, Jan. 1, 2008.

Cai et al, Monolithically Integrated Enhancement-and Depletion-Mode AlGaN/GaN HEMT for gaN Digital Integrated Circuits, vol. 53, No. 9, Sep. 1, 2006 (Sep. 1, 2006), pp. 2223-2230.

Chebrolu et al., "Recent progress in quantum dot sensitized solar cells: an inclusive review of photoanode, sensitizer, electrolyte, and the counter electrode", Journal of Materials Chemistry C 2019, pp. 4911-4933.

Enthaler et al, "Carbon dioxide and formic acid-the couple for environmental-friendly hydrogen storage?", Energy & Enviormental Science, 2010 pp. 1207-1217.

Fujii et al., "Photoelectrochemical Properties of Ingan for H2 Generation From Aqueous Water", Japanese Journal of Applied Physics, Japan Society of Applied Physics, JP, vol. 44, No. 10, Oct. 11, 2005 (Oct. 11, 2005), pp. 7473-7435,.

Nainani, "High-Performance III-V PMOSFET", May 2011, in 131 pages.

Ramakrishna et al. "Nitrogen doped CNTs supported Palladium electrocatalyst for hydrogen evolution reaction in PEM water electrolyser", International Journal of Hydrogen Energy, 2016 pp. 20447-20454.

Sritoma et al., IIA Novel GaN-Hemt based Inverter and Cascade Amplifier 11 , 2018 IEEE Electron Devices Kolkata Conference (EDKCON), IEEE, Nov. 24, 2018 (Nov. 24, 2018), pp. 465-469.

Sundaram et al, " Single-crystal nanopyramidal BGaN by nanoselective area growth on AlN/Si(111) and GaN templates"., Nanotechnology, vol. 27 (2016) 7 pages.

(56) References Cited

OTHER PUBLICATIONS

Tavares et al., "Implementation of a high frequency PWM signal in FPGA for GaN power devices switching", 2017 Brazilian Power Electronics Conference (COBEP), IEEE, Nov. 19, 2017 (Nov. 19, 2017), pp. 1-7.

Tripathy et al., "AlGaN/GaN two-dimensional-electron gas heterostructures on 200 mm diameter Si(111)", Applied Physics Letters, 101, 082110 (2012) https://doi.org/10.1063/1.4746751 Submitted: Feb. 7, 2012 , Accepted: Aug. 1, 2012 , Published Online: Aug. 23, 2012.

Wang et al, Germanium-Assisted Direct Growth of Graphene on Arbitrart Dielectric Substrates for Heating Device, Nano Micro Small, vol. 13, No. 28 Jul. 26, 2017.

Kumar et al. "Quantum dot activated indium gallium nitride on silicon as photoanode for solar hydrogen generation", Communcations Chemestry, in 7 pages.

Naveed ul Hassan Alvi et al., "InN/InGaN Quantum Dot Photoelectrode: Efficient Hydrogen Generation by Water Splitting at Zero Voltage", Nano Energy, vol. 13, Mar. 6, 2015 (Mar. 6, 2015), pp. 291-297.

\* cited by examiner

FIELD-PROGRAMMABLE GATE ARRAY DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present invention relates to field-programmable gate array, FPGA, devices. In particular the invention relates to artificial intelligence, AI, accelerator FPGA devices and other hardware for performing autonomous driving calculations.

Description of the Related Art

Field-programmable gate arrays, FPGAs, have long been used to build system prototypes of application-specific integrated circuits, ASICs, and system-on-a-chip, SoC, devices. FPGAs are versatile components comprising large amounts of configurable logic and are a natural choice for building and testing the new integrated circuits, ICs. As IC designs have grown in both size and complexity, FPGAs have also grown to provide ever-increasing and corresponding numbers of logical gates. FPGA prototypes enables development and testing of systems more flexibly and may grant software developers earlier access to more functionally advanced hardware platforms. FPGAs may be used in artificial intelligence, AI, accelerators that typically need to perform very large volumes of calculations. For autonomous driving applications, especially when relying on stored electrical energy for propulsion as in an electric vehicle, EV, this may become an issue as FPGAs generally consume more power than ASICs. Typical figures for AI accelerator FPGA power consumption may be in the range 1-5 kW. As such, an autonomous EVs range could be substantially reduced, e.g. by 5-10%. The higher power consumption may be attributed to more logical gates and more wiring between logical gates being required in an FPGA. The higher power consumption may additionally lead to larger thermal losses. Increases in temperature may additionally cause thermal runway effects as current leakage increases through the conventional Si transistors, commonly used in FPGAs. There is thus need for improvements within the technical field.

SUMMARY OF THE INVENTION

An object of the inventor has been to solve or at least mitigate some of the above issues in the state of the art.

According to a first aspect a field-programmable gate array, FPGA, device is provided. The FPGA device may be an artificial intelligence, AI, accelerator FPGA device. The FPGA device may be configured for, or suitable for, performing autonomous driving calculations. The FPGA device comprises a configurable logic block, CLB. The CLB comprises one logic inverter. The logic inverter comprises at least one high-electron-mobility transistor, HEMT. Each HEMT comprises an $Al_yGa_{y-1}N$ layer structure, wherein $0<y\leq1$, and a GaN layer structure.

The term "field-programmable gate array device" (and its corresponding acronym) should be understood as referring to a device based on or to a significant extent comprising an FPGA. It should not be interpreted as limiting the disclosure to just an FPGA as such.

The term "logic inverter" should be understood as a device that may convert a high input signal to a, relatively to the input signal, lower output signal and vice versa.

The term "high-electron-mobility transistor" (and its corresponding acronym) should be understood as a semiconductor device comprising at least two layer structures of different energy band gaps forming a common heterojunction interface enabling substantially two-dimensional electron transport. This interface may be understood to enable the forming of a so-called two-dimensional electron gas, 2DEG. A HEMT may alternatively be referred to as a heterojunction field-effect transistor, HFET.

Autonomous driving applications may require massive amounts of related calculations to be performed and data to be processed. This may be especially relevant for machine learning or AI based autonomous driving. The inventor has realized that nitride HEMTs may be beneficial for use in autonomous driving FPGA devices. This is due to their overall improved efficiency. Nitride HEMTs, e.g. HEMTs comprising a GaN and AlGaN layer structure interface generally provide higher voltage/current operation, higher switching frequencies, and less energy loss, compared to legacy metal-oxide-semiconductor field-effect transistors, MOSFETs. The energy efficiency aspect of nitride HEMTs would in particular provide advantages for autonomous driving FPGA devices onboard EVs such that a larger extent of the energy stored in e.g. a battery may be used for propelling the vehicle instead of performing autonomous driving calculations. Furthermore, the reduced energy losses may lead to less waste heat being produced. As such less effort may be put into addressing the waste heat build-up by e.g. cooling means. Furthermore, waste less heat may be preferable for safety aspects in regard to EV batteries.

The logic inverter may be a cascode inverter. The logic inverter may comprise at least two HEMTs. Each HEMT may comprise an $Al_yGa_{y-1}N$ layer structure, and a GaN layer structure.

The term "cascode" may refer to a two-stage circuit or amplifier with a common-source/emitter stage and a common-gate/base stage. The two stages usually comprise one transistor each.

The use of a cascode inverter setup may provide greater isolation of the inverter input and output signals by reducing reverse transmission of current as there is no direct coupling from the output node to the input node. Furthermore, the negative consequences of the Miller effect, such as e.g. an increase of the input capacitance, may be mitigated, thus increasing the inverter bandwidth.

The logic inverter may comprise at least one pull-up transistor.

The introduction of a pull-up transistor, e.g. being a part of a pull-up network, may improve inverter operation by providing a reliable way to produce high output signal levels.

The CLB may be a K-input CLB.

The term "K-input" should be understood to refer to a CLB comprising any integer K number of inputs.

The CLB may be configured for learning function mapping.

The FPGA device may further comprise a parallel shift register.

The FPGA device may further comprise a memory block. As such instructions and data may be stored by the FPGA device.

The FPGA device may further comprise a programmable input/output, I/O, block.

By the programmable IO block the FPGA device may be accessed by other devices, e.g. a central processing unit, CPU, in order to program the FPGA device.

The CLB, the parallel shift register, the memory block, and the programmable I/O block may all be formed on a same Si substrate.

By forming all components on the same substrate, the FPGA device may be miniaturized, and less material may be wasted. As Si IC fabrication methods are readily available to the skilled person, production complexity may be reduced. Si is also relatively abundant to the alternatives such as bulk nitride materials. Furthermore, less individual discrete components may need to be integrated post their individual formation.

The FPGA device may further comprise an interconnect configured to electrically connect at least two of the CLB, the parallel shift register, the memory block, and the programmable I/O block.

The term "interconnect" may be understood as an electrical/conductive interconnect able to transmit a current and hold a voltage potential.

The $Al_yGa_{y-1}N$ layer structures of each HEMT may be integrally formed. The GaN layer structures of each HEMT may be integrally formed.

As such, the same layer structures may be used for forming a plurality of HEMTs.

Each HEMT may further comprise a Si substrate. Each HEMT may further comprise a crystal transition layer structure arranged on the Si substrate.

By basing the HEMTs on a Si substrate, production and integration with other circuits and devices on a same substrate may be made less complex and more material efficient in line with the already provided advantages of using Si as a substrate. The crystal transition layer may be advantageous in adjusting the material structure or crystal lattice to requirements for creating high quality nitride materials and material interfaces.

The $Al_yGa_{y-1}N$ layer structure may be arranged on the crystal transition layer structure. The GaN layer structure may be arranged on the $Al_yGa_{y-1}N$ layer structure.

The GaN layer structure may be arranged on the crystal transition layer structure. The $Al_yGa_{y-1}N$ layer structure may be arranged on the GaN layer structure.

The crystal transition layer may comprise a plurality of vertical nanowire structures perpendicularly arranged on the Si substrate. The crystal transition layer may further comprise an $Al_xGa_{x-1}N$ layer structure, wherein $0 \leq x < 1$. The $Al_xGa_{x-1}N$ layer structure may be arranged to vertically and laterally enclose the vertical nanowire structures.

Such a crystal transition layer may be used to provide a good material and lattice conditions for epitaxial forming/growth of high-quality nitride layer structures. The crystal transition layer may also be made thinner and thus less material intensive than conventional buffer layer-based approaches to achieve higher quality nitride layer structures.

According to a second aspect an AI processing system is provided. The system comprises an FPGA device according to the first aspect. The system further comprises a sensor, providing an analog sensor output signal. The system further comprises an analog-to-digital converter, ADC, for processing said sensor output signal. The system further comprises a digital-to-analog converter, DAC, for regulating said sensor. A memory block of the FPGA device holds stored instructions for operating the AI processing system.

In addition to the advantages provided by the first aspect, such a system may be advantageously employed to perform autonomous driving calculations. The system may feature the ADC and/or the DAC comprise nitride HEMTs and hence, further integration of devices may be achieved. The system may essentially be integrated as a SoC.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description.

Hence, it is to be understood that this invention is not limited to the particular component parts of the device described or acts of the methods described as such device and method may vary. It is also to be understood that the terminology used herein is for purpose of describing particular embodiments only and is not intended to be limiting.

It must be noted that, as used in the specification and the appended claims, the articles "a," "an," "the," and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The above and other aspects of the present invention will, in the following, be described in more detail with reference to appended figures. The figures should not be considered limiting; instead they should be considered for explaining and understanding purposes.

As illustrated in the figures, the sizes of layers and regions may be exaggerated for illustrative purposes and, thus, are provided to illustrate the general structures.

Like reference numerals refer to like elements throughout.

DETAILED DESCRIPTION OF THE PREFERRED EMBODIMENT

The present invention will now be described more fully hereinafter with reference to the accompanying drawings, in which currently preferred embodiments of the invention are shown. This invention may however, be embodied in many different forms and should not be construed as limited to the embodiments set forth herein; rather, these embodiments are provided for thoroughness and completeness, and to fully convey the scope of the invention to the skilled person.

Figure 1:
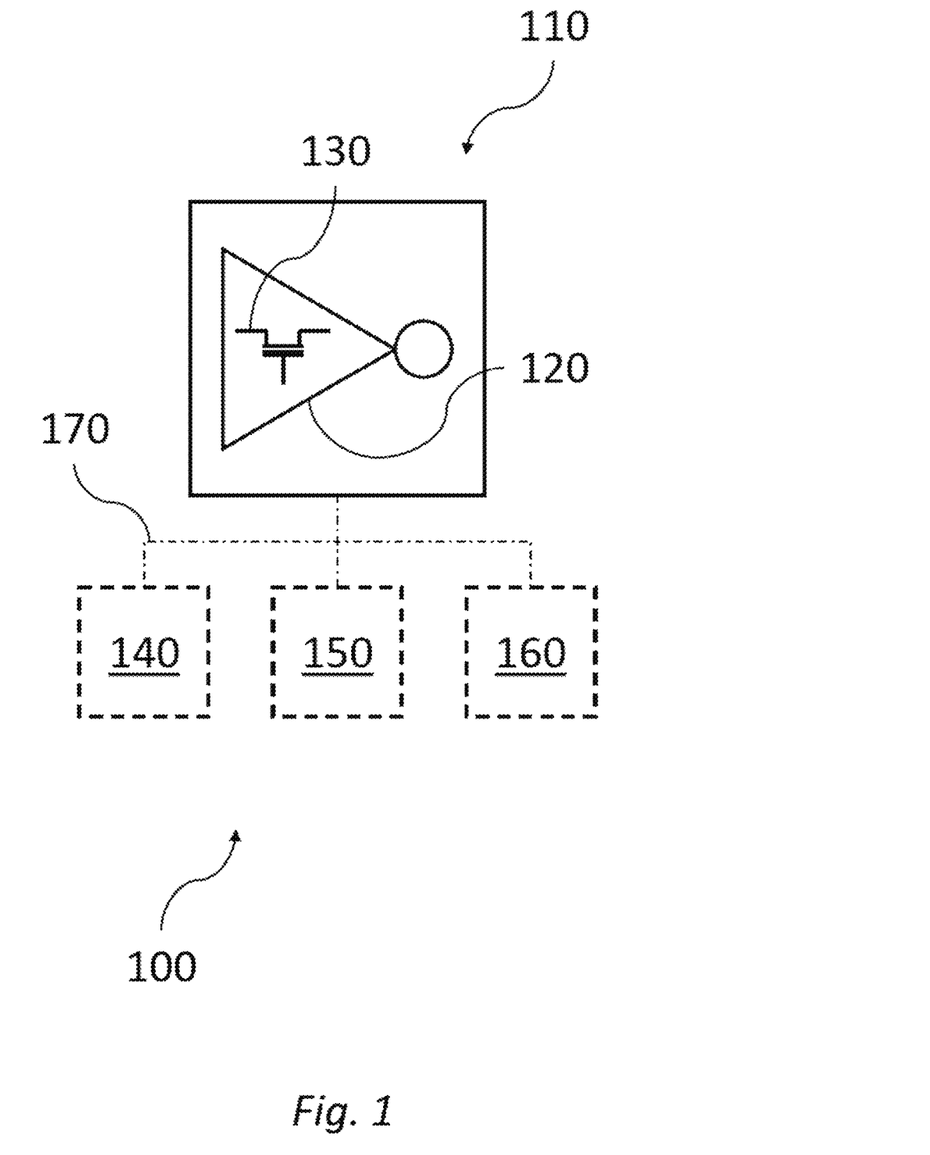
FIG. 1 shows a schematic block diagram of an FPGA device.

FIG. 1 shows an FPGA device 100. The FPGA device 100 may be an AI accelerator FPGA device. The FPGA device 100 may be configured for performing autonomous driving calculations. The FPGA device 100 may be suitable for performing autonomous driving calculations. The autonomous driving calculations may comprise performing machine learning, or AI assisted calculations relating to the operation of an autonomous vehicle. The vehicle may be an autonomous road vehicle. The vehicle may be partially or fully autonomous in its operation. The vehicle may be an EV with an electrochemical battery and electrical propulsion means e.g. an electric motor. The FPGA device 100 may be installed in the vehicle. The FPGA device 100 may additionally find utility in a data center installation.

Figure 2:
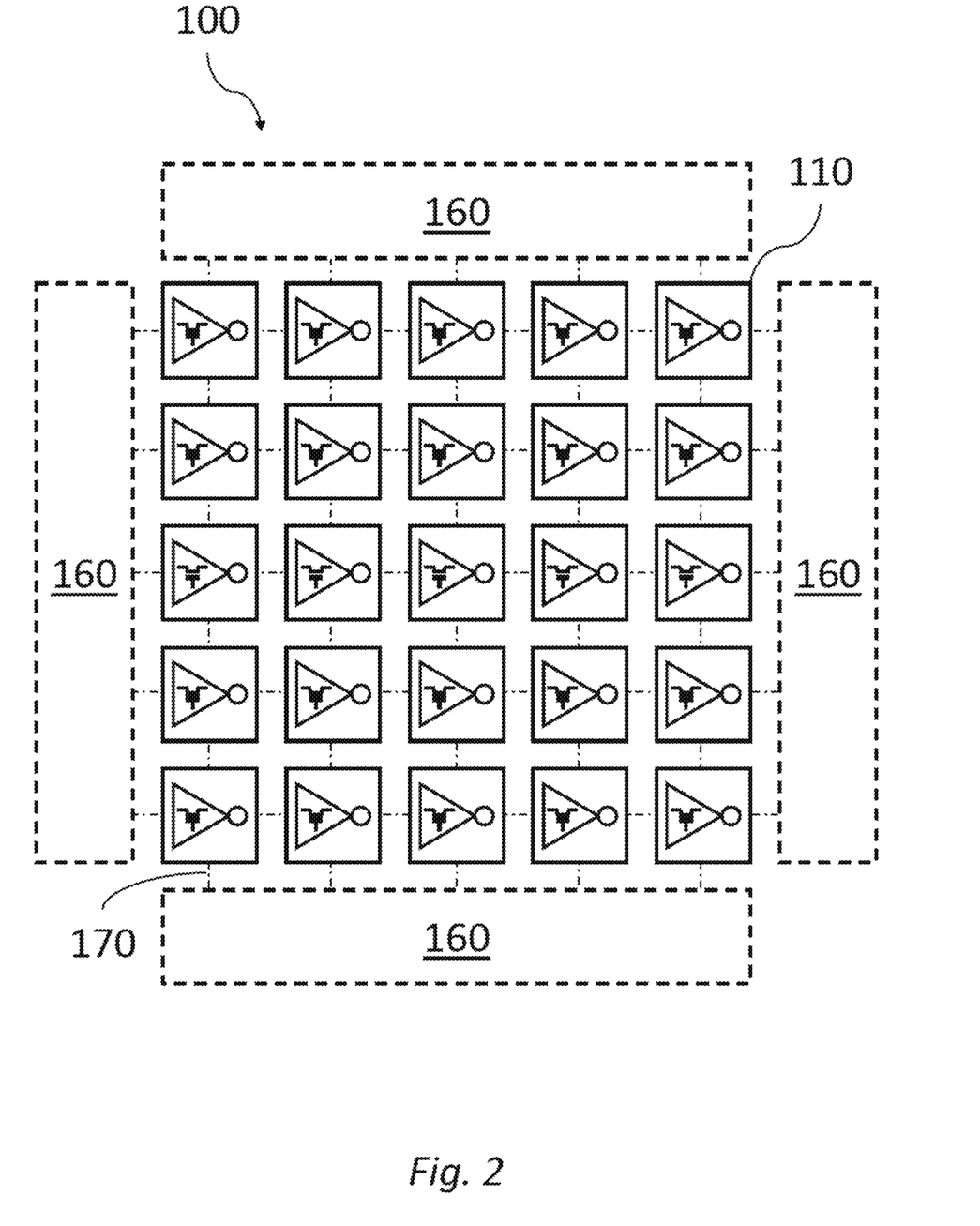
FIG. 2 shows a schematic block diagram of an FPGA device comprising a plurality of CLBs.

The FPGA device 100 comprises a CLB 110. The FPGA device 100 may comprise a plurality of CLBs 110 as shown in FIG. 2. The CLB 110 may be a K-input CLB, wherein K represents an integer corresponding to the number of inputs of the CLB 110. The integer K may e.g. be 3, 4, or 8. The CLB 110 may be configured for learning function mapping. The CLB 110 may be exemplified by FIG. 3. The CLB 110 comprises at least one logic inverter 120.

Figure 3:
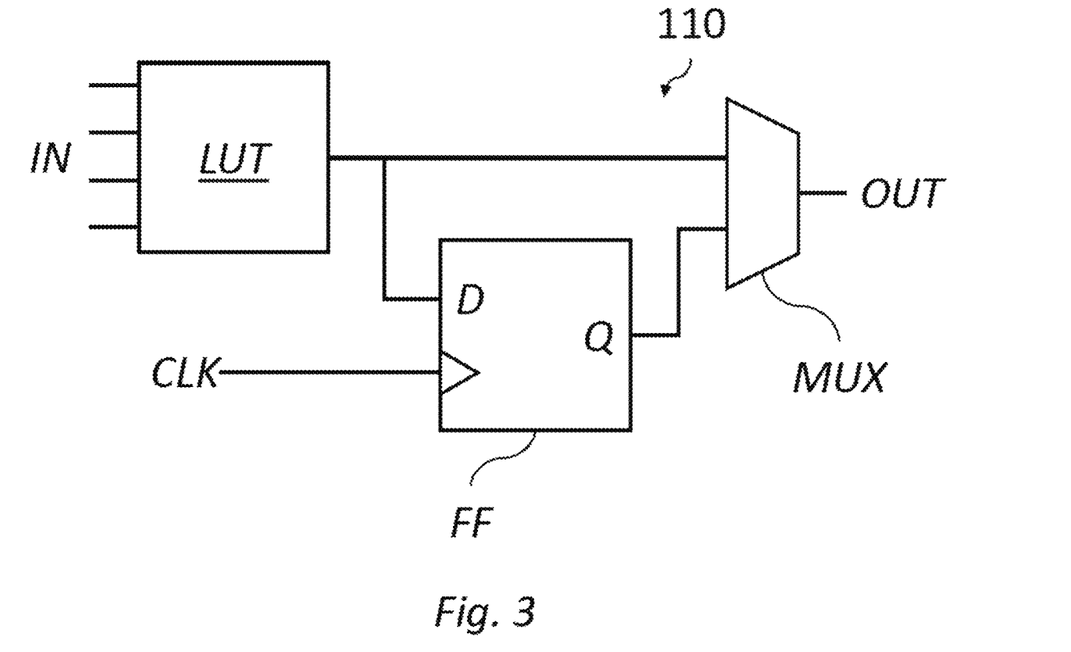
FIG. 3 shows a schematic block diagram of an exemplary CLB.

FIG. 3 shows the CLB comprising a look-up-table, LUT, input stage with four inputs, IN. This may be understood as K=4. The LUT output is shown to connect to an input, referred to as input D, of a flip-flop, FF. The FF may be a so-called D-type FF. The LUT output line is also shown to connect to a multiplexer MUX. The FF may receive a further input in the form of a clock signal, CLK. The FF may provide an output, referred to as output Q. The output Q is shown to connect to the MUX. The MUX may produce the CLB output signal, OUT.

Figure 4:
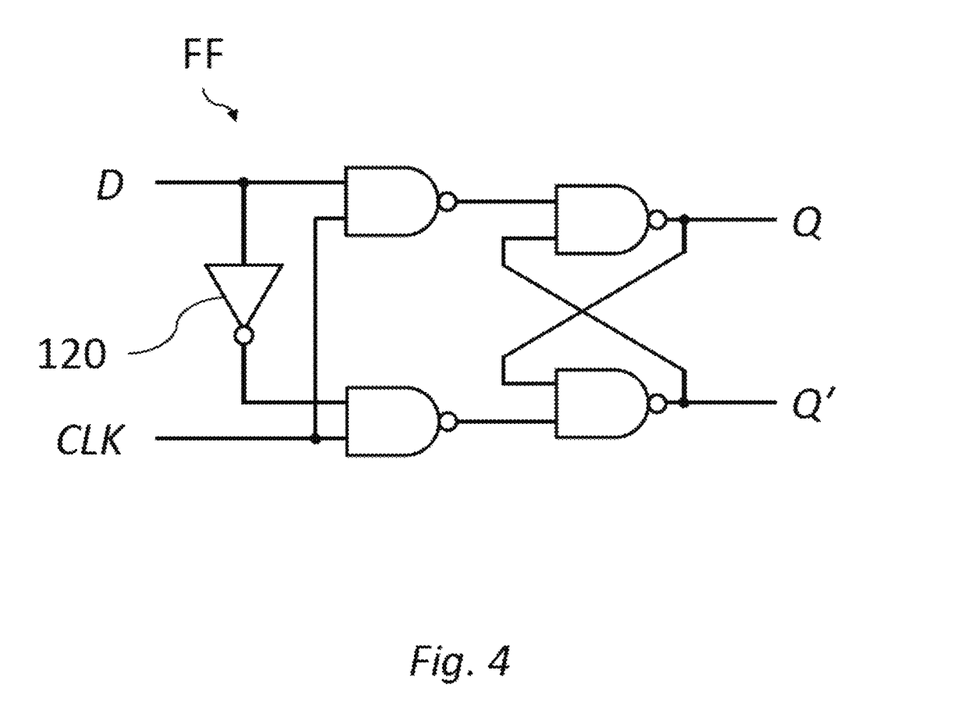
FIG. 4 shows an exemplary flip-flop logic circuit.

FIG. 4 shows a logic circuit diagram of a D-type FF. As mentioned in connection with FIG. 3, the FF may comprise a D input and a CLK input. The FF may comprise a Q output and a Q' output. The Q' output may be considered the inverse or complementing logical output to the Q output. E.g. if Q corresponds to a binary 1, Q' would correspond to a binary 0 and vice versa. The FF is shown to comprise a logic inverter 120 at the D input line. This logic inverter 120 may be considered the logic inverter of the CLB 110. The FF is further shown to comprise four logical NOT-AND, NAND, gates. The NAND gates may comprise a logical AND gate and a logical inverter 120.

Figure 5A:
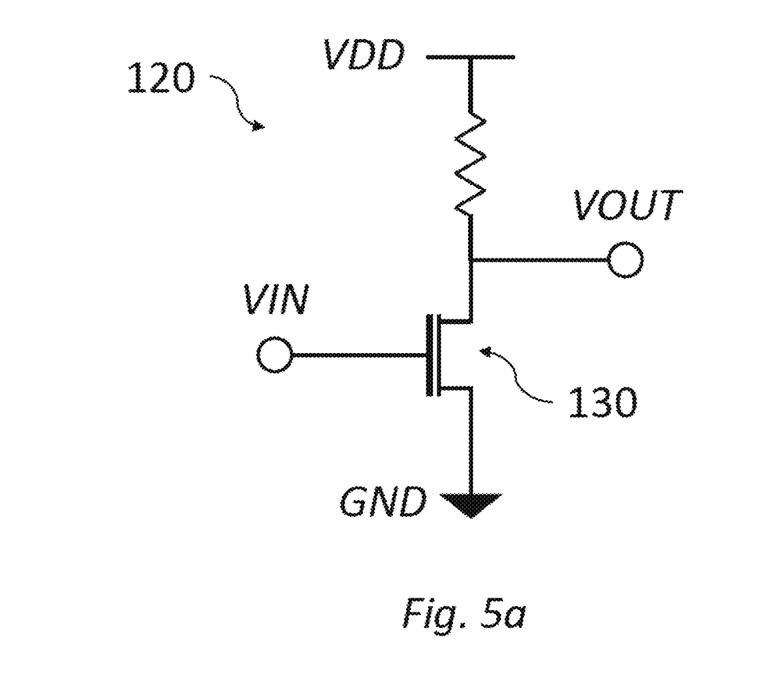
FIG. 5a shows a logic inverter comprising one HEMT.

The logic inverter 120 comprises at least one HEMT 130. FIG. 5a shows the logic inverter 120 comprising one HEMT 130. The HEMT 130 is shown to be arranged as a pull-down network of the logic inverter 120. The logic inverter 120 comprises a resistor as its pull-up network, between the output line, VOUT, and the VDD node. The resistor may be realized as an always-on transistor with a specific on state resistance, thus corresponding to that of a discrete resistor. The logic inverter of FIG. 5a is a so-called 1 transistor, 1T, inverter. A high signal/binary 1 on the input line, VIN, connected to the HEMTs 130 gate node, may result in a low signal/binary 0 at VOUT and vice versa. The 1T inverter may see a direct current path between the VDD node and the ground node, GND, via the HEMTs 130 drain and source nodes, when the HEMTs 130 channel is open.

Figure 5B:
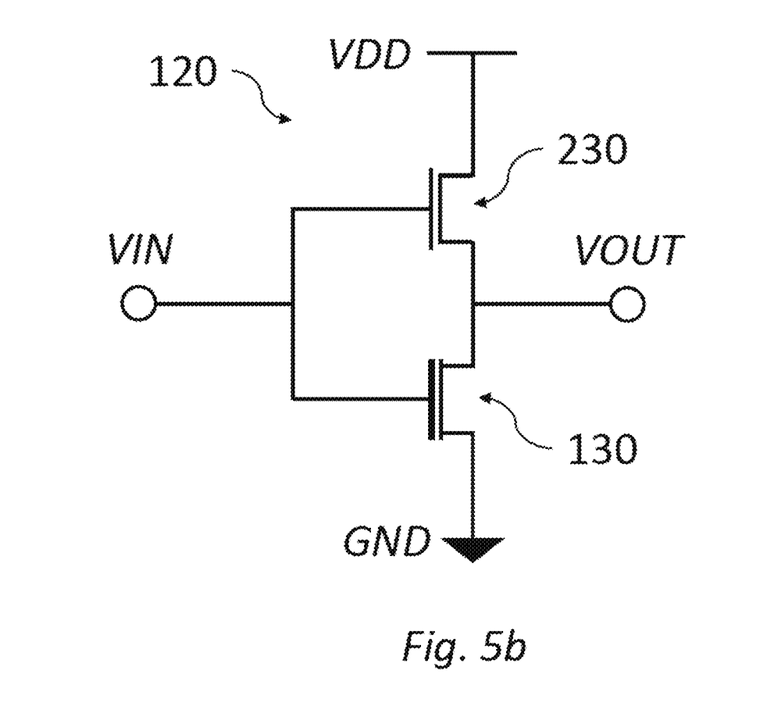
FIG. 5b shows a logic inverter comprising one HEMT and one pull-up transistor.

FIG. 5b shows the logic inverter 120 comprising a pull-up transistor 230 instead of, as in FIG. 5a, having a resistor act as a pull-up network. The pull-up transistor 230 may be connected with its gate/base node to the input line, VIN. The pull-up transistor 230 may be connected with its source/emitter and drain/collector nodes connected to either one of the VDD and VOUT nodes. Such a logic inverter 120 may feature reduced leakage current from the VDD node to the GND node as the direct current path there between is only open for a short time during switching. Rise and fall times on the VOUT node may also be shorter due to this. The voltage at the VOUT node may also be larger than without a pull-up transistor 230.

The pull-up transistor 230 may be a p-type MOSFET transistor, PMOS. The pull-up transistor 230 may be a Si-based transistor. The pull-up transistor 230 may be a Ge-based transistor. The pull-up transistor 230 may be a GaN/nitride-based transistor. The pull-up transistor 230 may be carbon nanotube-based transistor. The pull-up transistor 230 may be a high-hole-mobility transistor, HHMT. The pull-up transistor 230 may be a tunnel field-effect transistor, TFET. The pull-up transistor 230 may be a bipolar junction transistor, BJT.

Figure 6A:
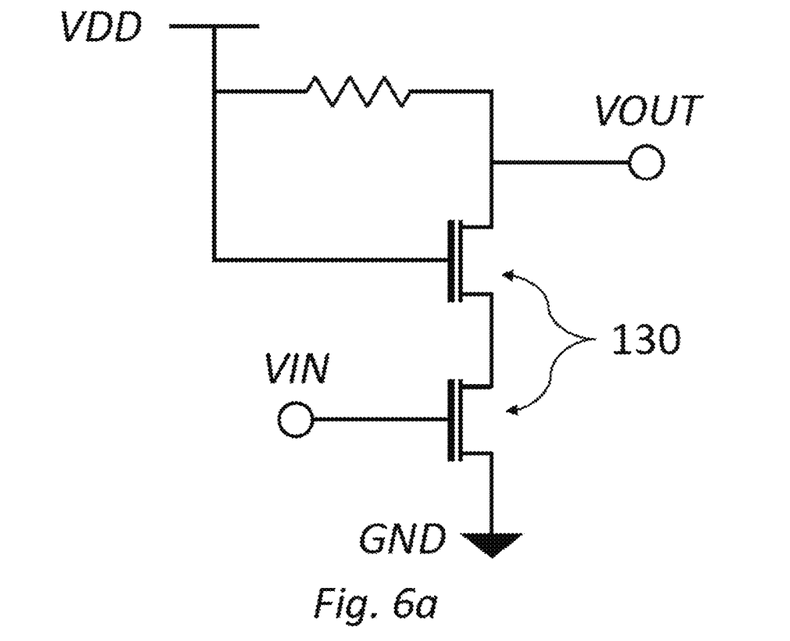
FIG. 6a shows a cascode inverter comprising two HEMTs.

FIG. 6a shows the logic inverter 120 being a cascode inverter. The logic inverter 120 may comprise at least two HEMTs 130. The two HEMTs 130 are shown to be arranged as a pull-down network of the logic inverter 120. A resistor is shown to form the pull-up network in a similar way to FIG. 5a. The top HEMT 130 is shown to be connected at its gate node to the VDD node. As such, the top HEMT 130 may be considered as an always-on transistor. The top HEMT 130 may additionally be considered a common gate stage of the cascode configured logic inverter 120. The bottom HEMT 130 is shown to be connected at its gate node to the input line, VIN. The bottom HEMT 130 may be considered as a common source stage of the cascode configured logic inverter 120.

Figure 6B:
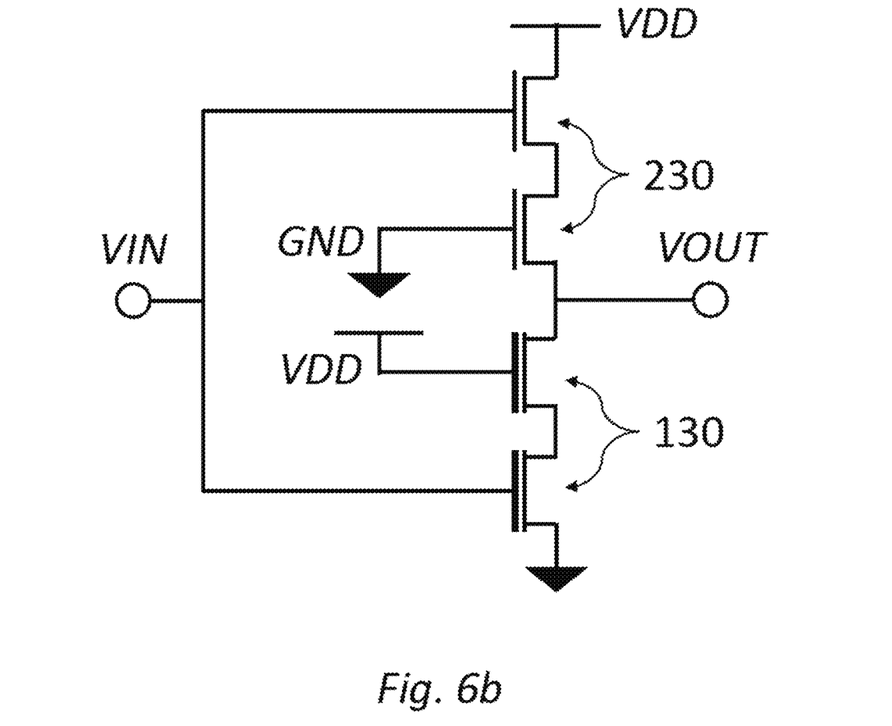
FIG. 6b shows a cascode inverter comprising two HEMTs and two pull-up transistors.

FIG. 6b shows the cascode configured logic inverter 120 comprising two pull-up transistors 230 as part of its pull-up network instead of the single resistor of FIG. 6a. The top pull-up transistor 230 is shown to be connected with its gate node to the input line, VIN. The top pull-up transistor 230 may be considered a common source/emitter stage of the cascode configured logic inverter 120. The bottom pull-up transistor 230 is shown to be connected with its gate node to the GND node. The bottom pull-up transistor 230 may be considered an always-on transistor. The bottom pull-up transistor 230 may additionally be considered a common gate stage of the cascode configured logic inverter 120.

Figure 7:
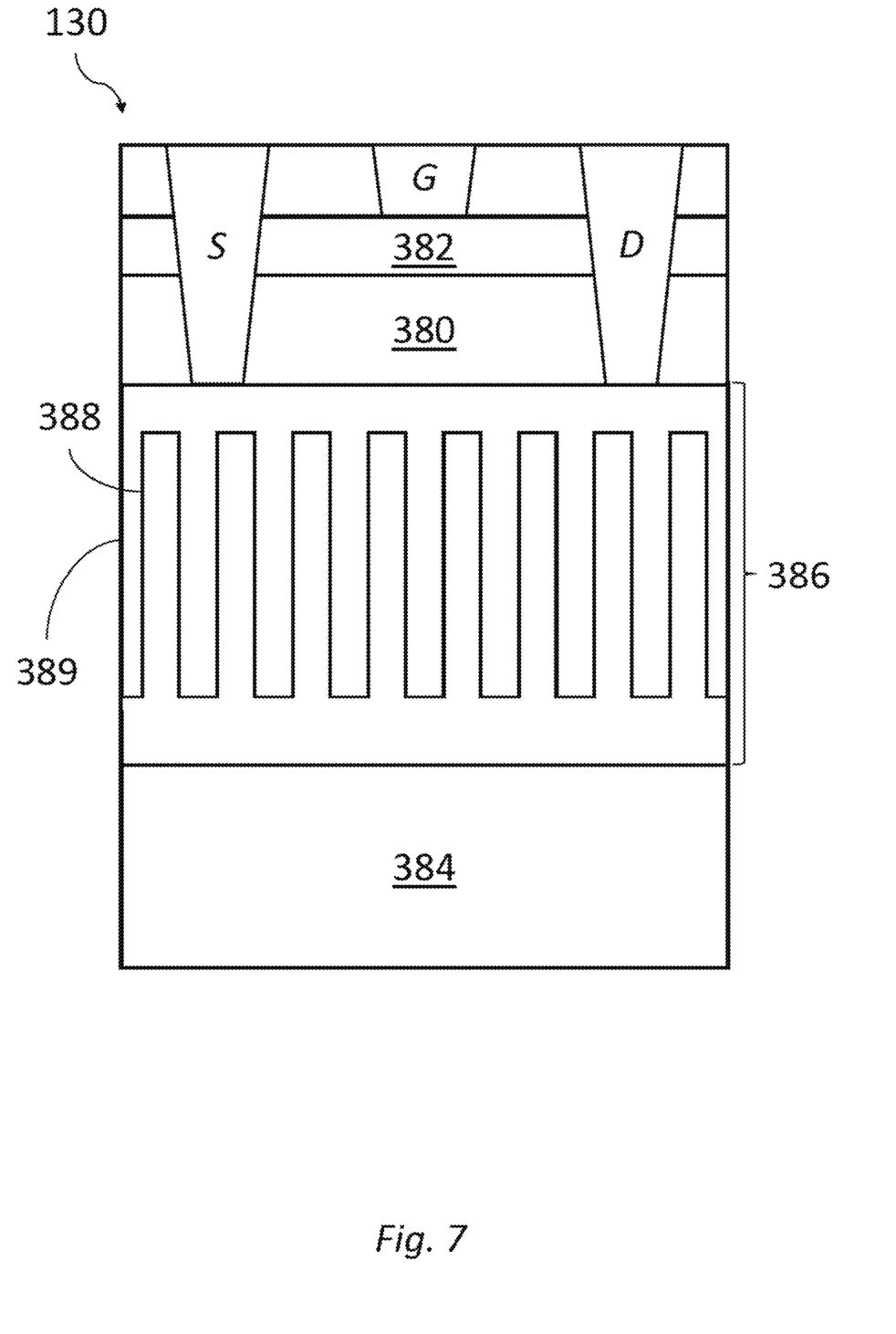
FIG. 7 shows a cross-sectional view of semiconductor layer structures and a HEMT.

The HEMT 130 comprises an $Al_yGa_{y-1}N$ layer structure 380, wherein $0<y\leq1$. The HEMT 130 also comprises a GaN layer structure 382. These layer structure features are not shown in FIG. 1 but are instead shown in FIG. 7, to which the reader's attention is now directed. FIG. 7 shows a cross-sectional view of a HEMT 130 comprising the aforementioned layer structures 380, 382. FIG. 7 shows the HEMT 130 being based on a Si substrate 384.

The Si substrate 384 may be a substantially monocrystalline Si structure. The Si substrate 384 may be a Si substrate with a <111> Miller index. The Si substrate 384 may be a Si wafer formed with the Czochralski process. The Si substrate 384 may be a chip or die from a larger Si wafer.

FIG. 7 further shows a crystal transition structure 386 being formed on the Si substrate 384. The crystal transition structure 286 is shown to comprise a plurality of vertical nanowire structures 388. The vertical nanowire structures 388 are further shown to be perpendicularly arranged on the Si substrate 384. The vertical nanowire structures 388 may comprise GaN or AlN or AlGaN.

FIG. 7 also shows the crystal transition structure 286 comprising an $Al_xGa_{x-1}N$ layer structure 389, wherein $0 \leq x < 1$. The $Al_xGa_{x-1}N$ layer structure 389 is shown to be arranged to vertically and laterally enclose the vertical nanowire structures 388. The $Al_xGa_{x-1}N$ layer structure 389 may comprise a plurality of sublayers. The plurality of sublayers may feature a gradually decreasing value for the variable x.

Such a structure as well as HEMTs based thereon is further described in the European Patent Application EP19215267, which is hereby incorporated by reference. FIGS. 1-6 and their corresponding passages in the text provide context and alternatives to the layer structures and HEMTs 130 of the present disclosure. FIGS. 7-12 and their corresponding passages in the text should be understood as context about methods for producing the same layer structures and HEMTs 130. The summary of the referenced application provides context on technical advantages and definitions of the language therein. The wording "crystal transition structure" does not appear in the referenced application but may be understood as referring to the combined structure comprising every layer and structure intermediate to the "Si substrate" (reference 102) and the "third semiconductor layer" (reference 130).

FIG. 7 shows the $Al_yGa_{y-1}N$ layer structure 380 being arranged on the crystal transition structure 386 and the GaN layer structure 382 being arranged on the $Al_yGa_{y-1}N$ layer structure 380. Alternatively, the GaN layer structure 382 may be arranged on the crystal transition structure 386 and the $Al_yGa_{y-1}N$ layer structure 380 may be arranged on the GaN layer structure 382.

FIG. 7 further shows source S, drain D, and gate G contacts of the HEMT 130. The drain contact D should not be confused with the input D of the flip-flop in either FIG. 3 or FIG. 4. The contacts source, drain, and gate contacts may be formed by metal material. The source and drain contacts may comprise Ti, Al, Cu, Ni, and/or Au. The source and drain contacts may comprise compounds or alloys such as e.g. AlCu. The gate contact may in addition to the materials mentioned for the source and drain contacts, also or alternatively comprise Pd and/or Au. As for the source and drain contacts compounds and alloys are also options for the gate contact.

In the case that the logic inverter 120 is a cascode inverter each of the logic inverters 120 comprises at least two HEMTs 130 comprising an $Al_yGa_{y-1}N$ layer structure 380, and a GaN layer structure 382. The $Al_yGa_{y-1}N$ layer structures 380 of each HEMT 130 of the logic inverter 120, cascode or otherwise configured, may be integrally formed. The GaN layer structures 382 of each HEMT 130 of the logic inverter 120, cascode or otherwise configured, may be integrally formed. The layer structures 380, 382 of HEMTs 130 may be separated by passivation/spacer structures to prevent the individual HEMTs 130 unintentionally affecting each other during operation.

FIG. 1 shows that the FPGA device 100 may comprise a parallel shift register 140. The parallel shift register 140 may be a part of the CLB 110. The parallel shift register 140 may be considered to correspond to a LUT of the CLB 110 e.g. as the one shown in FIG. 3.

FIG. 1 further shows that the FPGA device 100 may comprise a memory block 150. The memory block 150 may be a part of the CLB 110. The memory block 150 may comprise a random-access memory, RAM. The RAM may be static, SRAM, or dynamic, DRAM. Other alternative memory solutions may include e.g. magnetoresistive RAM, MRAM.

FIG. 1 and FIG. 3 further shows that the FPGA device 100 may comprise programmable I/O block(s) 160. FIG. 1 further shows that the FPGA device 100 may comprise an interconnect 170. The interconnect 170 may be configured to electrically connect at least two of the CLB 110, the parallel shift register 140, the memory block 150, and the programmable I/O block 160. FIG. 3 shows the interconnect 170 electrically connecting an array of CLBs 110 and programmable I/O blocks 160.

The CLB 110, the parallel shift register 140, the memory block 150, and the programmable I/O block 160 may all be formed on a same Si substrate 384.

Figure 8:
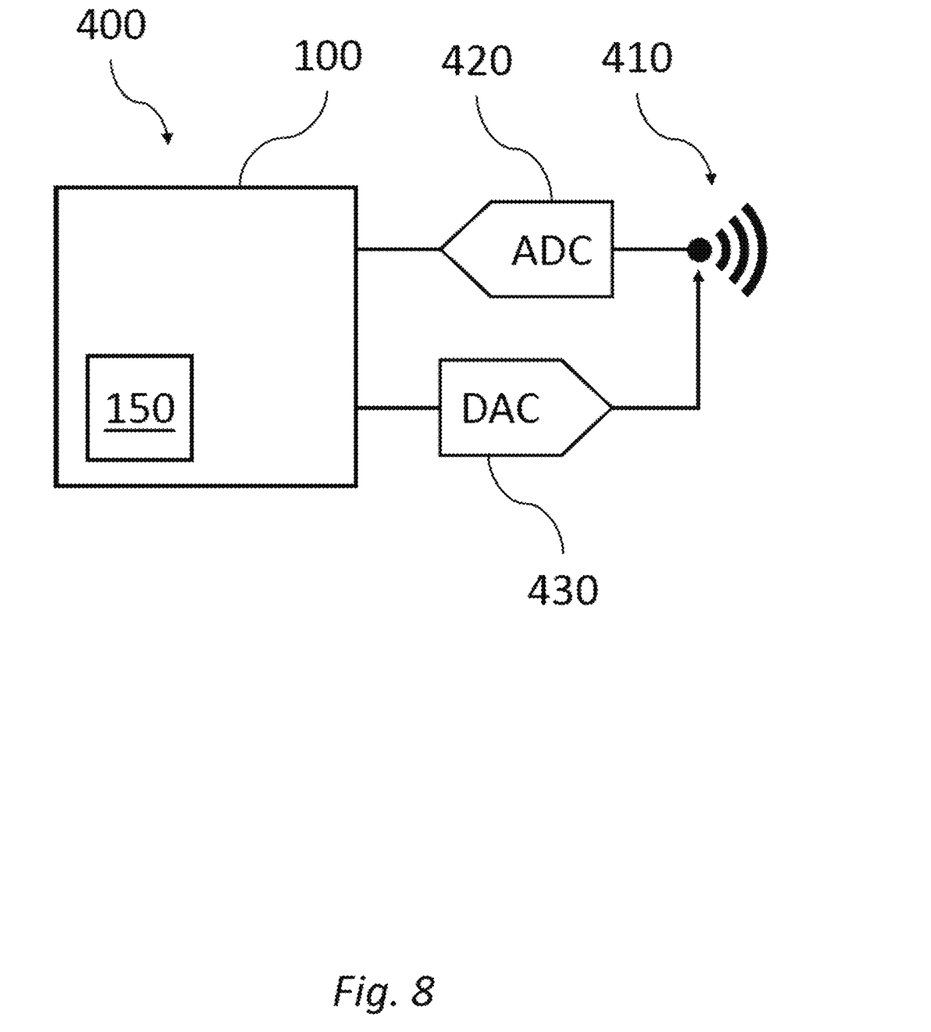
FIG. 8 shows schematic block diagram of an AI processing system.

FIG. 8 shows an AI processing system 400. The AI processing system 400 is shown to comprise the FPGA device 100. The FPGA device 100 may comprise a memory block 150. The memory block 150 may hold, or be configured to hold, stored instructions for operation the AI processing system 400.

The AI processing system 400 is further shown to comprise a sensor 410. The sensor may provide, or be configured to provide, an analog sensor output signal. The sensor 410 may be e.g. a camera or stereo camera setup comprising image sensors, a radar/laser/acoustic range finder/object detection sensor, a microphone, an accelerometer, a gyroscope, a temperature sensor, a barometer, a motion sensor, a radio frequency sensor, etc.

The AI processing system 400 is further shown to comprise an ADC 420. The ADC 420 may be provided or configured for receiving the sensor output signal, from the sensor 410, and processing the sensor output signal. In particular the ADC 420 may process the analog sensor output signal as to provide a corresponding digital signal to the FPGA device 100. The ADC 420 may be a microchip type ADC.

An exemplary ADC 420 is further described in the European Patent Application EP19205265, which is hereby incorporated by reference. The block and circuit diagrams of FIGS. 1-2 and their corresponding passages in the text provide context to how the ADC 420 may be implemented. FIGS. 3-5 and their corresponding passages in the text provide context on the layer structures and HEMTs 130 of the present disclosure. In particular, the referenced application provides further context on integration of two HEMTs 130 in close proximity. This may provide improvements to e.g. the cascode configured logical inverters 120 of the FPGA device 100 as overall device footprint may be minimized. The summary of the referenced application provides further context on technical advantages and definitions of the language therein.

The AI processing system 400 is further shown to comprise a DAC 430. The DAC 430 may be provided or configured for regulating the sensor 410. The DAC 430 may receive digital instructions from the FPGA device and provide a corresponding analog signal to the sensor 410. The DAC 430 may be a microchip type DAC.

Additionally, variations to the disclosed embodiments can be understood and effected by the skilled person in practicing the claimed invention, from a study of the drawings, the disclosure, and the appended claims.

What is claimed is:
1. An AI processing system comprising:
a field-programmable gate array, FPGA, device comprising:
a plurality of configurable logic blocks, CLBs, each CLBs comprising a logic inverter;
a parallel shift register;

a memory block storing instructions for operating the AI processing system;
a programmable input/output, I/O, block;
a sensor configured to provide an analog sensor output signal;
an analog-to-digital converter, ADC, configured to process the analog sensor output signal; and
a digital-to-analog converter, DAC, configured to regulate the sensor;
wherein the logic inverter comprises one or more high-electron-mobility transistor, HEMTs, each comprising an $Al_yGa_{y-1}N$ layer structure, wherein $0<y\le1$; and a GaN layer structure, the one or more HEMTs being supported by a Si substrate; and
wherein the CLBs, the parallel shift register, the memory block, and the programmable I/O block are all formed on the Si substrate.

2. The AI processing system according to claim 1, wherein the ADC is configured to process the analog sensor output signal into a corresponding digital signal to the FPGA device.

3. The AI processing system according to claim 1, wherein the ADC is a microchip type ADC.

4. The AI processing system according to claim 1, wherein the sensor comprises one or more of:
a camera or stereo camera setup comprising one or more image sensors,
a radar/laser/acoustic range finder/object detection sensor,
a microphone,
an accelerometer,
a gyroscope,
a temperature sensor,
a barometer,
a motion sensor, and
a radio frequency sensor.

5. The AI processing system according to claim 1, wherein the logic inverter is a cascade inverter comprising at least two high-electron-mobility transistors, HEMTs.

6. The AI processing system according to claim 1, wherein the logic inverter comprises at least one pull-up transistor.

7. The AI processing system according to claim 1, wherein the CLB is a K-input CLB.

8. The AI processing system according to claim 1, wherein the FPGA device further comprises an interconnect electrically connecting at least two of:
the CLB;
the parallel shift register;
the memory block; and
the programmable I/O block.

9. The AI processing system according to claim 1, wherein a crystal transition layer structure is arranged on the Si substrate, wherein the crystal transition layer is arranged in between the Si substrate and the one or more HEMTs, wherein crystal transition layer comprises a plurality of vertical nanowire structures perpendicularly arranged on the Si substrate, and an $Al_xGa_{x-1}N$ layer structure, wherein $0\le x<1$, wherein the $Al_xGa_{x-1}N$ layer structure is arranged to vertically and laterally enclose the vertical nanowire structures.

10. The AI processing system according to claim 1,
wherein the logic inverter comprises two or more HEMTs,
wherein the $Al_yGa_{y-1}N$ layer structures of two or more HEMTs are integrally formed, and
wherein the GaN layer structures of the two or more HEMTs are integrally formed.

* * * * *